US010432238B1

(12) United States Patent
Luo et al.

(10) Patent No.: US 10,432,238 B1
(45) Date of Patent: Oct. 1, 2019

(54) DETUNING MULTIBAND TUNABLE MATCHING NETWORKS

(71) Applicant: pSemi Corporation, San Diego, CA (US)

(72) Inventors: Chengkai Luo, San Diego, CA (US); Fleming Lam, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 16/005,589

(22) Filed: Jun. 11, 2018

(51) Int. Cl.
*H04B 1/00* (2006.01)
*H04B 1/44* (2006.01)
*H04B 15/00* (2006.01)
*H03F 1/56* (2006.01)
*H03F 3/193* (2006.01)
*H03F 3/21* (2006.01)

(52) U.S. Cl.
CPC ............. *H04B 1/006* (2013.01); *H03F 1/565* (2013.01); *H03F 3/193* (2013.01); *H04B 1/44* (2013.01); *H04B 15/005* (2013.01); *H03F 3/21* (2013.01); *H03F 2200/222* (2013.01); *H03F 2200/294* (2013.01); *H03F 2200/387* (2013.01)

(58) Field of Classification Search
CPC ........ H04B 1/006; H04B 15/005; H04B 1/44; H03F 1/565; H03F 3/193; H03F 2200/294

USPC .......................................................... 455/77
See application file for complete search history.

(56) References Cited

U.S. PATENT DOCUMENTS

| 2013/0187828 | A1* | 7/2013 | Desclos | H03H 7/38 343/861 |
| 2014/0022132 | A1* | 1/2014 | Badaruzzaman | H03H 7/40 343/745 |
| 2014/0030990 | A1* | 1/2014 | Smith | H04B 1/0475 455/114.1 |
| 2014/0194074 | A1* | 7/2014 | Klomsdorf | H04B 1/0458 455/77 |
| 2015/0048898 | A1* | 2/2015 | Gaynor | H03H 7/40 333/124 |

\* cited by examiner

*Primary Examiner* — Ayodeji O Ayotunde
(74) *Attorney, Agent, or Firm* — Jaquez Land Greenhaus LLP; John Land, Esq.

(57) ABSTRACT

Detuning and isolation techniques for a multiband tunable matching network used in multi-transceiver RF systems. Embodiments include an amplifier and a multiband tunable matching network (MN) coupled to the amplifier. The multiband tunable MN is configured to detune to an isolation OFF state from an ON state, wherein the match tuning in the isolation OFF state is different than match tuning in the ON state. In an example detuning, the match tuning in the isolation OFF state is in a different frequency band than a frequency band of match tuning in the ON state and is selected based on the frequency band of match tuning in the ON state.

20 Claims, 8 Drawing Sheets

Nominal OFF State for All Matching Networks

ON State for Matching Network 1

Detuned Isolation OFF State for Matching Network 1

500

┌─────────────────────────────────────┐
│ Detune to an isolation OFF state from an │
│ ON state a multiband tunable matching │
│ network (MN) coupled to an amplifier, │─ 510
│ wherein the match tuning in the isolation │
│ OFF state is different than match tuning in │
│ the ON state │
└─────────────────────────────────────┘

┌─────────────────────────────────────┐
│ Select a frequency band corresponding to │
│ an isolation OFF state of the multiband │
│ tunable MN, wherein the selected frequency │─ 520
│ band is in a different frequency band than a │
│ frequency band of match tuning in the ON │
│ state │
└─────────────────────────────────────┘
                    │
                    ▼
┌─────────────────────────────────────┐
│ Match tune the multiband tunable MN to the │
│ selected frequency band to detune the │─ 530
│ multiband tunable MN │
└─────────────────────────────────────┘

FIG. 5B

DETUNING MULTIBAND TUNABLE MATCHING NETWORKS

BACKGROUND

(1) Technical Field

Disclosed embodiments relate to electronic circuits, and more particularly to matching networks for radio frequency integrated circuits.

(2) Background

Matching networks are used in radio frequency (RF) circuits, including integrated circuits (ICs), to match the input impedance of an electrical load or the output impedance of its corresponding signal source to maximize power transfer or minimize signal reflection from the load. For example, matching networks may be used between various RF components, such as between a filter and an amplifier, or between different RF paths. Matching networks typically include capacitors and inductors. Tunable matching networks may also include switches, such as field effect transistors (FETs), that allow for switching between different levels of matching, and which also may function as an isolation component. Isolation is typically achieved by opening and closing of one or more switches in a matching network to nominally block signal propagation through the matching network. However, by the nature of the matching network, it may provide a peak in gain or transfer characteristics at a resonant frequency, even when an adjacent RF block is disabled and isolation is desired At low frequencies, signal leakage through isolation switches is typically negligible, but at high frequencies, the isolation provided by switches—particularly FET switches and especially MOSFET switches—against leakage signals may become severely degraded due to parasitic capacitances in the switches. For example, in a tunable multi-band RF system, when an RF circuit turns the tunable matching network of one RF signal path (e.g., a receiver signal path) to an OFF state as the RF circuit switches to a different signal path (e.g., a transmitter signal path), a significant RF leakage signal may seep through from the input to the output of the OFF-state matching network (e.g., less than about −70 dB isolation level).

For example, FIG. 1 is a circuit diagram of a typical prior art isolation switch 100. In the illustrated example, a transistor T1, such as a FET, is positioned on a substrate 101 that couples an RFin node to an RFout node. In an OFF (non-conducting) state, the transistor T1 nominally provides isolation between RFin and RFout nodes, such as during an OFF or standby state of the overall circuit (not shown). However, during high frequency transmission, the substrate 101 and the transistor T1 may suffer from leakage signal(s) passing from RFin to RFout nodes due to parasitic capacitances in the substrate 101 and the transistor T1. Examples of such parasitic capacitances are symbolically shown as capacitances C1 between the RFin and RFout nodes, C2 between the source S and drain D nodes of the transistor T1, C3 between the source S and gate G node of the transistor T1, and C4 between the gate G and drain D nodes of transistor the T1. At sufficiently high frequencies, the parasitic capacitances C1-C4 in effect become virtual short circuits and thus allow for leakage signal to pass from RFin to RFout nodes.

Accordingly, there is a need for matching networks that provide more effective isolation in multi-channel RF systems. The present invention meets this need and more.

SUMMARY

Embodiments of the invention encompass detuning and isolation techniques for a multiband tunable matching network used in multi-channel RF systems. Disclosed embodiments include an amplifier and a multiband tunable matching network (MTMN) coupled to the amplifier. The MTMN is configured to detune the match when the MTMN is not needed to maximize power transfer. The net effect is improved isolation performance in a frequency band of interest. Thus, the match tuning in the isolation OFF state is deliberately chosen to be different than match tuning in the ON state. In an example detuning, a frequency band of the isolation OFF state is selected based on a frequency band of the ON state and from a different frequency band than the frequency band of the ON state. Disclosed embodiments include two or more matching networks which enable detuning an MTMN to in effect shift frequency bands for improved isolation, particularly at higher frequencies (e.g., 3.3 GHz+).

Advantages of various disclosed embodiments include improved overall isolation for the MTMN, while needing little or no added circuitry to achieve the desired isolation level.

The details of one or more embodiments are set forth in the accompanying drawings and the description below. Other features, objects, and advantages of these embodiments will be apparent from the description and drawings, and from the claims.

DESCRIPTION OF THE DRAWINGS

FIG. 5A is a process flow diagram showing a first method of detuning and isolating an MTMN according to the disclosed embodiments.

FIG. 5B is a process flow diagram showing a second method of detuning and isolating an MTMN according to the disclosed embodiments.

Like reference numbers and designations in the various drawings indicate like elements.

DETAILED DESCRIPTION

Embodiments of the invention encompass novel detuning and isolation techniques for a multiband tunable matching network (MTMN) used in multi-channel RF systems. Disclosed embodiments include an amplifier and an MTMN coupled to the amplifier. The MTMN is configured to detune the match when the MTMN is not needed to maximize power transfer. The net effect is improved isolation performance in a frequency band of interest. Thus, the match tuning in the isolation OFF state is deliberately chosen to be different than match tuning in the ON state. In an example detuning, a frequency band of the isolation OFF state is selected based on a frequency band of the ON state and from a different frequency band than the frequency band of the ON state. Disclosed embodiments include two or more matching networks which enable detuning an MTMN to in effect shift frequency bands for improved isolation, particularly at higher frequencies (e.g., 3.3 GHz+).

Figure 2A:
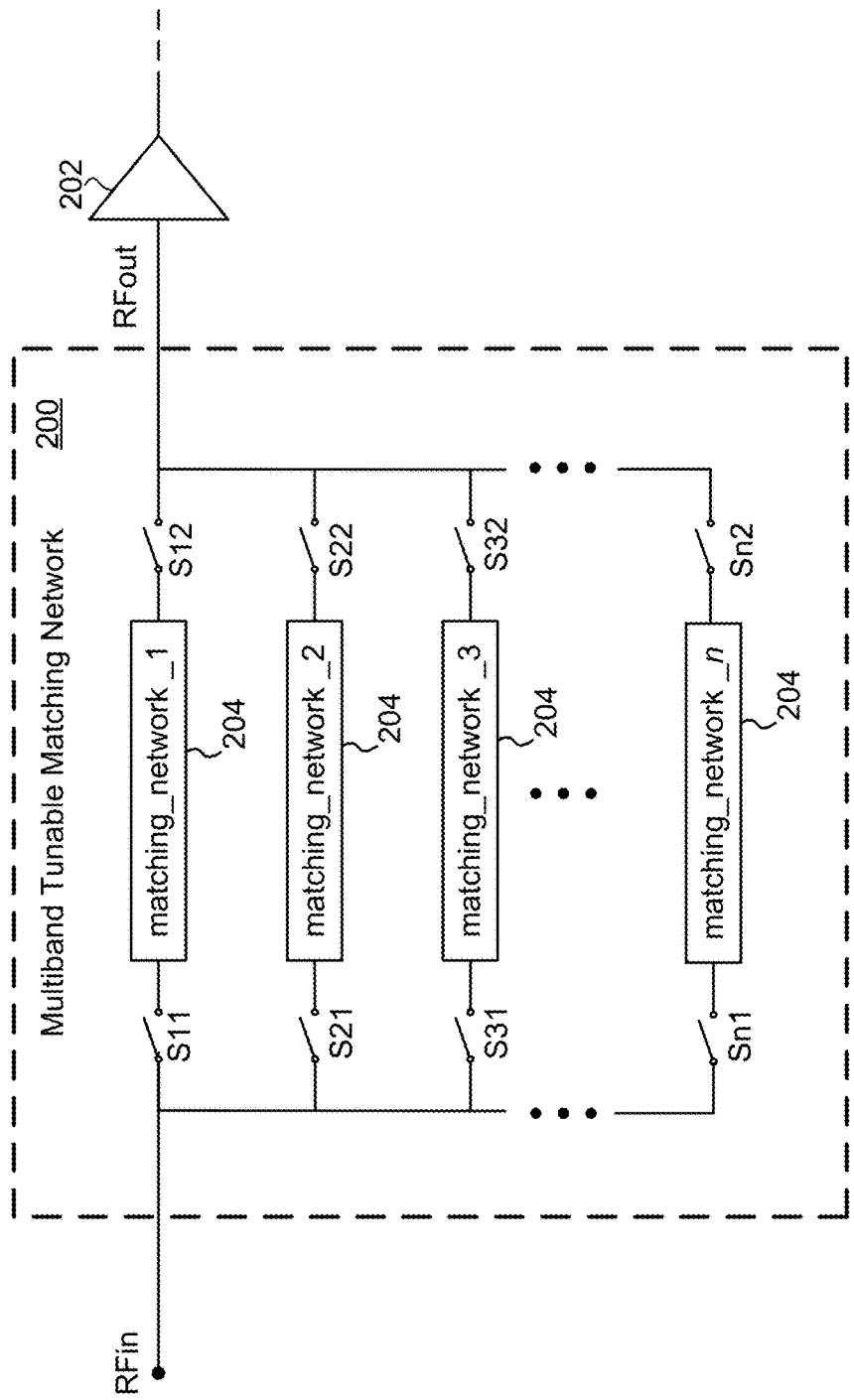
FIGS. 2A-2C are example block diagrams illustrating a parallel-element multiband tunable matching network that is coupled to an amplifier (e.g., a multiband amplifier).
Figure 2B:
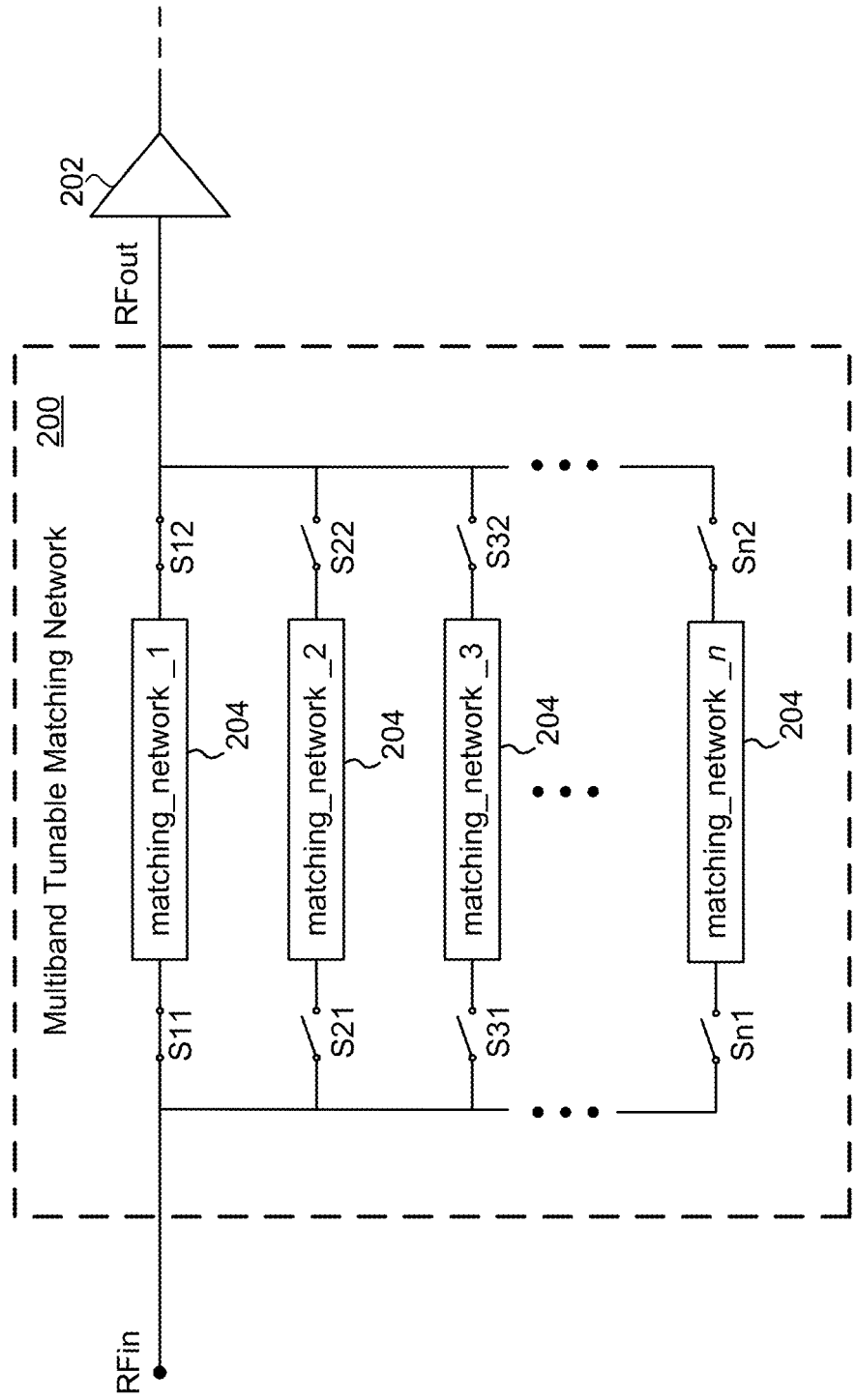
Figure 2C:
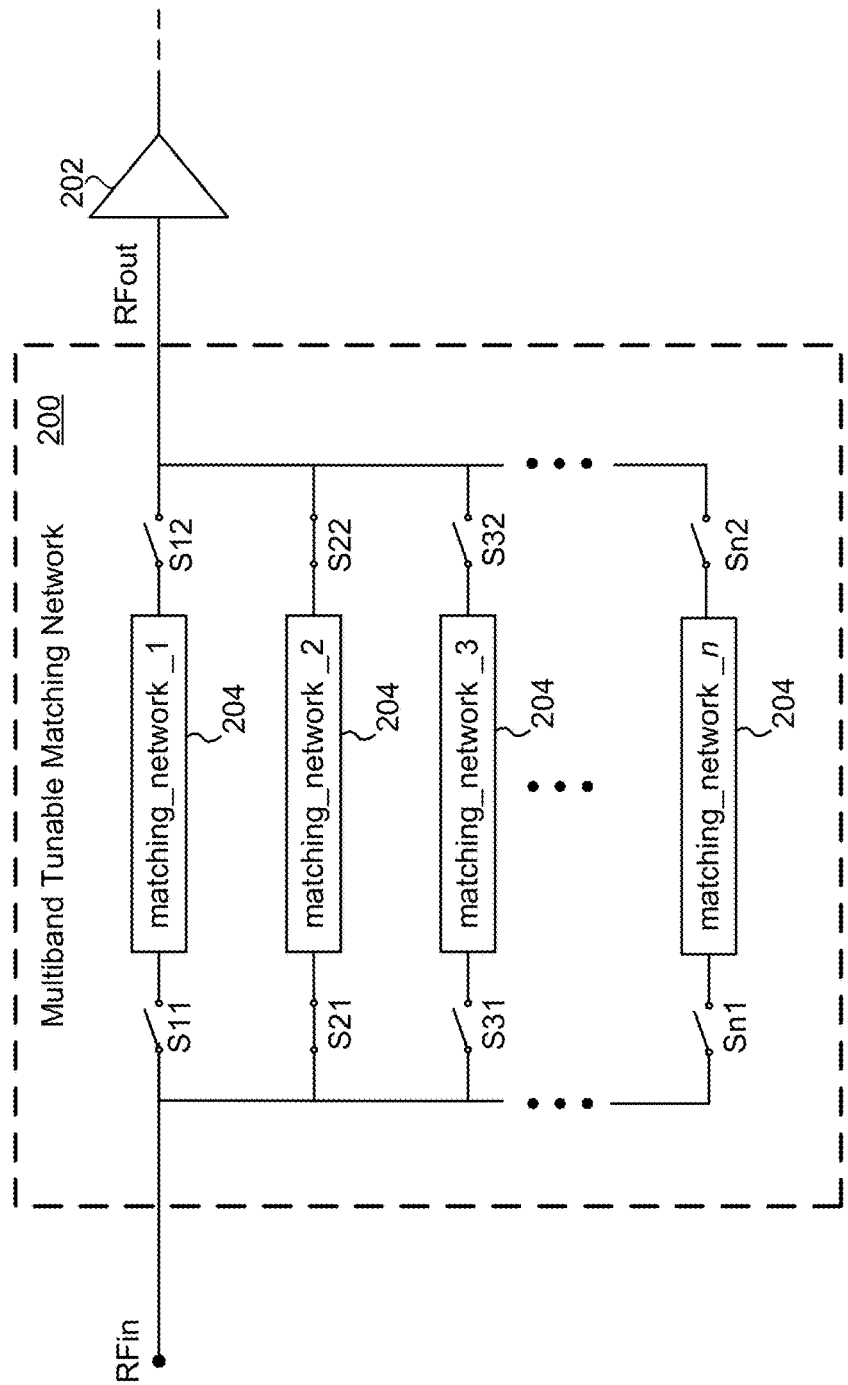

FIGS. 2A-C are example block diagrams illustrating a parallel-element MTMN 200 that is coupled to an amplifier 202 (e.g., a multiband amplifier). The amplifier 202 may be a low noise amplifier (LNA) or power amplifier (PA), which are typically used in radio frequency receive and transmit paths, respectively. As described further below in greater detail, the tuning of the MTMN 200 is intentionally configured to detune the match when the amplifier 202 is in an isolation OFF state compared to an ON state where the amplifier 202 provides gain. Detuning is accomplished by configuring the MTMN 200 to operate at a different frequency band in the isolation OFF state compared to the ON state.

As shown in FIG. 2A, the MTMN 200 includes two or more matching networks 204, such as matching_network_1 through matching_network_n. In an example embodiment, at least one of the matching networks (e.g., matching_network_1) corresponds to a first frequency band, such as a High Band (HB) in a frequency range of 3.3-3.8 GHz, and another matching network (e.g., matching_network_2) corresponds to a different frequency band, such as a Mid Band (MB) in a lower frequency range of 2.3-3.7 GHz. In the illustrated embodiment, each of the n matching networks 204 corresponds to a different frequency band with little or no overlap with the other matching networks 204. A set of input switches, such as S11 through Sn1, couples each of the corresponding matching_network_1 through matching_network_n to an RFin node. Similarly, a set of output switches, such as S12 through Sn2, couples each of the corresponding matching_network_1 through matching_network_n to an RFout node. In the configuration shown in FIG. 2A, all input switches S11-Sn1 and output switches S12-Sn2 are in an open, nominally isolated OFF state.

FIG. 2B shows the MTMN 200 in an ON state, in which the MTMN 200 is configured to switchably couple an RF signal applied to the RFin node through the RFout node to the amplifier 202 via one of the matching networks 204. In the example shown in FIG. 2B, a signal in the HB frequency range may be coupled through matching_network_1 by closing its corresponding input and output switches S11 and S12, while setting the other matching networks in the MTMN 200 (such as matching_network_2 through matching_network_n) to a nominally isolated OFF state by opening at least one of their corresponding switches (in the illustrated example, switches S21-Sn1 and S22-Sn2 are open).

Without more, the OFF state shown in FIG. 2A would suffer the same problems as conventional designs due to signal leakage through the switches S11-Sn1, S12-Sn2. However, as shown in FIG. 2C, an MTMN 200 embodiment in accordance with the present invention is further configured to deliberately mistune the MTMN 200 when in the isolation OFF state to further improve isolation in this state. For example, the MTMN 200 may be used in an RF system in which matching_network_1 is used for HB frequencies. Thus, in an ON state, switches S11, S12 would be closed, and all other switches S21-Sn1 and S22-Sn2 would be open. In an isolation OFF state, switches S11, S12 for matching_network_1 are opened, but instead of leaving all other switches S21-Sn1, S22-Sn2 open (as in a conventional circuit), the MTMN 200 is configured to switchably couple the amplifier 202 to another matching network 204—that is, to a "detuning" matching network. In this example, in the isolation OFF state where HB matching_network_1 is OFF, matching_network_2 (e.g., configured for a MB frequency range) is turned ON by closing its corresponding input and output switches S21, S22. The other matching networks (e.g., matching_network_3 through matching_network_n) remain decoupled by keeping open at least one of their corresponding input and output switches, as shown in FIG. 2C. The selection of which matching network 204 in the MTMN 200 to turn ON in the isolation OFF state, and hence which frequency band for leakage signals to couple to the amplifier 202, is made based on the frequency band of the matching network 204 used in the ON state (in this case, the HB frequency band of matching_network_1).

Figure 1:
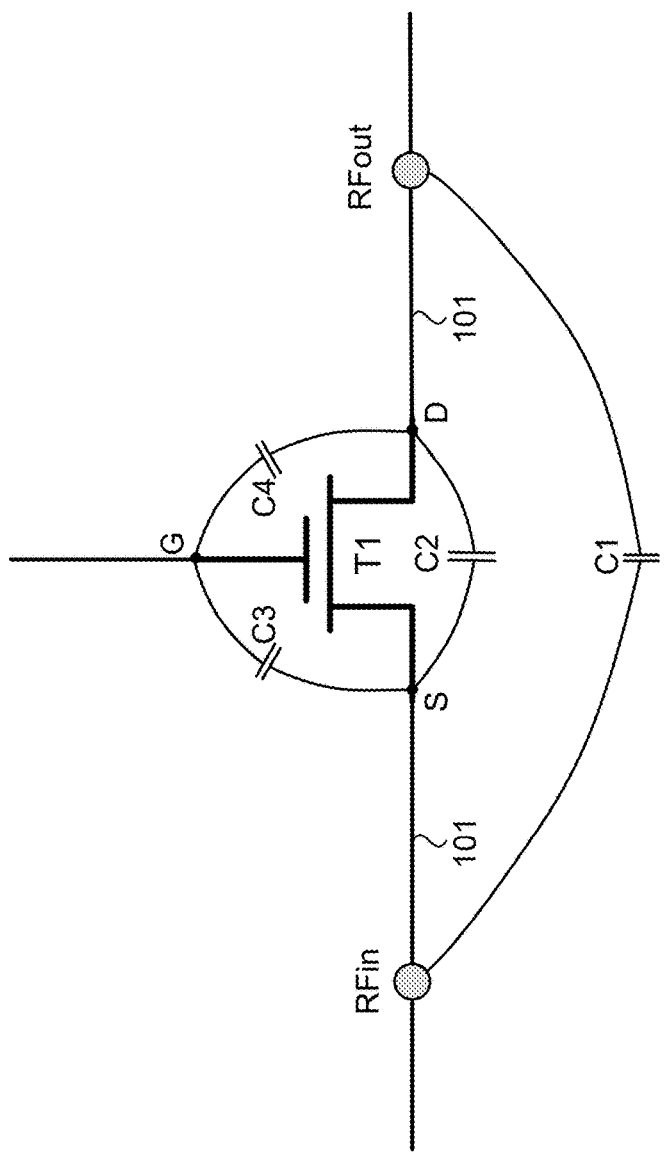
FIG. 1 is a circuit diagram of a typical prior art isolation switch.

Coupling the amplifier 202 to a different matching network 204 tuned for a different frequency band than that used for the ON state matching network 204 enables the MTMN 200 to shift leakage signals to a higher or lower band matching network 204. This shift allows the MTMN 200 to use the selected isolation OFF state matching network 204 to resonate out (i.e., tune out) the above-described (see FIG. 1) parasitic resonances associated with various switches and substrates that cause signal leakage between the RFin and RFout nodes. The isolation OFF state configuration, in which at least one alternate matching network 204 is in an ON state, thus enables improved isolation, particularly at higher frequencies (e.g., 3.3 GHz+). In an example embodiment, detuning the MTMN 200 for the isolation OFF state may configure the coupled ON-state "detuning" matching network 204 to behave as a notch filter that rejects parasitic resonance frequencies that enable a received leakage signal to leak to the amplifier 202. Detuning in such a way may also provide improved broadband isolation.

It should be noted that the switch configurations shown in FIGS. 2A-2C are examples only, and other switch configurations (such as single pole-multiple throw, or SPMT) can also be used to couple and/or decouple any particular matching network 204 in the MTMN 200 from the amplifier 202, and are contemplated to be within the scope of the present disclosure. In addition, one or more of matching_network_1 through matching_network_n may be located on different receive or transmit paths, and may even correspond to different frequency settings, such as for Wifi, GSM, etc., RF systems.

Figure 3A:
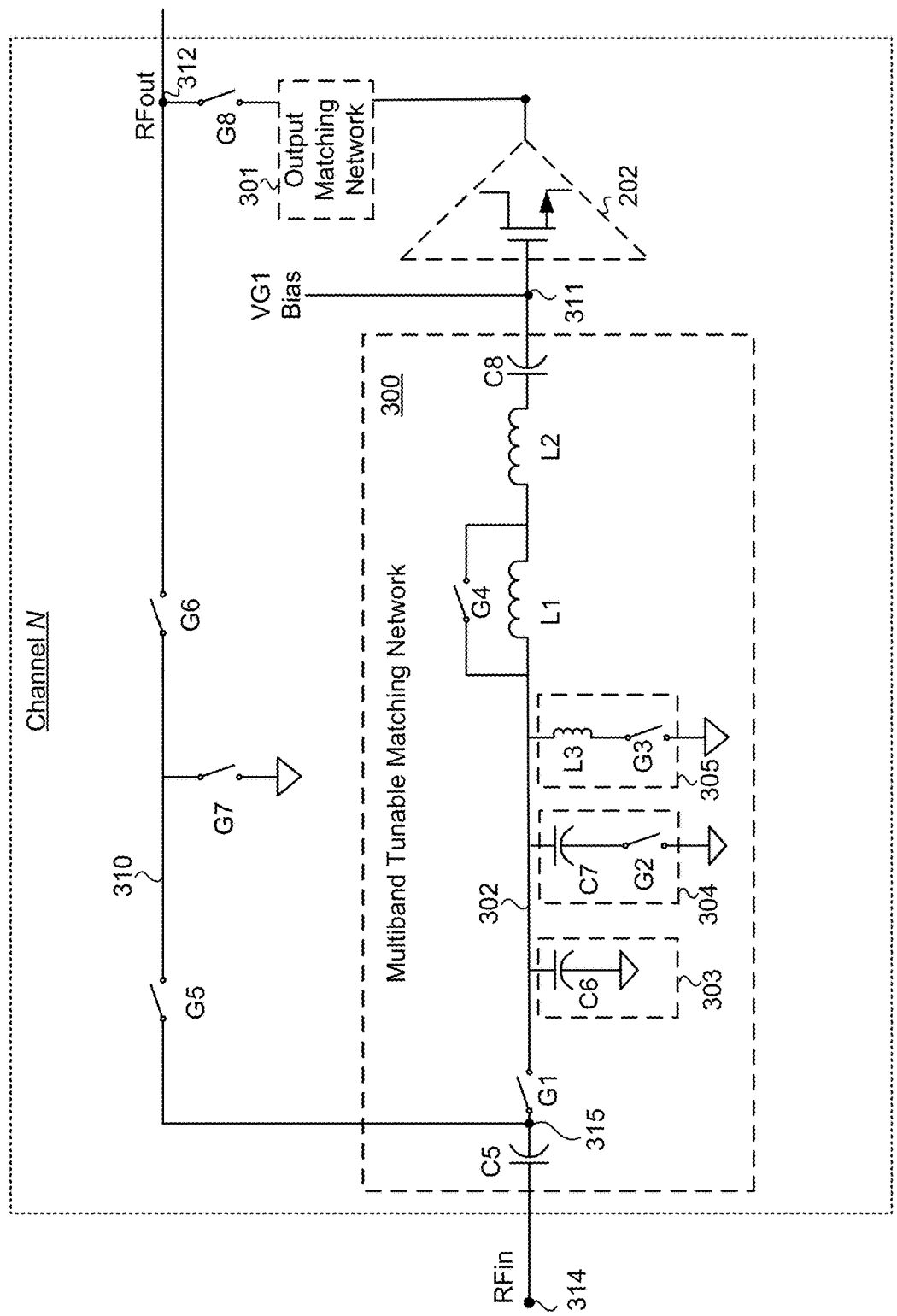
FIG. 3A is a schematic diagram of an example combined-element MTMN that may be used in an RF channel (e.g., Channel N).

The MTMN 200 shown in FIGS. 2A-2C shows a configuration having separate parallel matching networks 204. However, as is known, equivalent functionality can be achieved by combining the tuning elements (e.g., capacitors and inductors) and associated switches of the matching networks 204 into a more compact circuit having multiple selectable configurations. For example, FIG. 3A is a schematic diagram of an example combined-element MTMN 300 that may be used in an RF channel (e.g., Channel N). As shown in FIG. 3A, the MTMN 300 is coupled in series to an RFout node 312 via an amplifier 202 (e.g., an LNA or PA), Output Matching Network 301, and a switch G8. The MTMN 300 includes a signal path 302 coupling an RFin node 314 to an intermediate RF output node 311 through intermediate components described below. In this example, an isolation switch G1 is positioned in series along signal path 302 and coupled at a first end to the RFin node 314, such as via a first DC blocking capacitor C5.

Parallel capacitive ground shunts 303 and 304, and an inductive ground shunt 305 are coupled to the signal path 302 and to a second end of the isolation switch G1. Capacitive ground shunt 303 includes capacitor C6; capacitive ground shunt 304 includes capacitor C7 coupled in series with switch G2; and inductive ground shunt 305 includes inductor L3 coupled in series with switch G3. Inductors L1 and L2, and a second DC blocking capacitor C8 are series coupled to the signal path 302 and to the intermediate RF output node 311. A bypass switch G4, positioned in series on signal path 302 and in parallel with inductor L1, enables bypassing inductor L1 when closed. In an example implementation, capacitors C5, C6, C7, and C8 have values of 10.8 pF, 0.7 pF, 0.6 pF, and 12 pF, respectively, and inductors L, L2, and L3 have values of 1.6 nH, 2.2 nH, and 3.4 nH, respectively.

The various matching networks within the MTMN 300 which correspond to different frequency bands or states (as previously described for the parallel-element MTMN 200 shown in FIGS. 2A-2C) can be selected based on the ON or OFF states of switches G2, G3, and G4, as shown in TABLE 1 below:

TABLE 1

| Band | G2 | G3 | G4 |
|---|---|---|---|
| Auxiliary Configuration | closed | closed | open |
| MB | closed | open | open |
| HB | open | open | closed |

Referring to TABLE 1, the MTMN 300 is configured to operate in a high-band (HB) frequency range (e.g., 3.3-3.8 GHz) when switches G2 and G3 are open and bypass switch G4 is closed. The MTMN 300 is configured to operate in a mid-band (MB) frequency range (e.g., 2.3-2.7 GHz) when switch G2 is closed, and switch G3 and bypass switch G4 are open. Lastly, the MTMN 300 is configured to operate in an "auxiliary configuration" when switches G2 and G3 are closed and bypass switch G4 is open. The "auxiliary configuration" represents an RF matching network configuration that would normally not be used for operational purposes, but is available to be used as an isolation OFF state. In some embodiments, the auxiliary configuration is not needed since matching networks in other bands are available to be used for an isolation OFF state for each operational matching network band. Note that in isolation OFF state, switch G1 is opened to further improve isolation.

In the example circuit shown in FIG. 3A, a channel bypass path 310 couples the RFin node 314 to the RFout node 312, such as by connecting to path 302 at node 315. Switches G5, G6, G7, and G8 are placed along or coupled to the channel bypass path 310 and are used in the isolation OFF state to bypass the gain from the amplifier 202. For example, in an ON (gain) state, switches G1, G7, and G8 are closed, and switches G5 and G6 are open. This allows for a signal received at the RFin node 314 to travel to the RFout node 312 through the path 302, the amplifier 202, and the Output Matching Network 301. Conversely, in an isolation OFF state, switches G1, G7, and G8 are opened, and switches G5 and G6 are closed, which allows a signal applied to RFin node 314 to bypass the amplifier 202. As described above, to further improve isolation, the MTMN 300 is intentionally configured to detune the match to the amplifier 202 to a different frequency band to improve isolation in the band of interest, such as by configuring switches G2, G3, and G4 according to Table 1 to tune the MTMN 300 to a different band than the band of interest. For example, if an RF signal applied at RFin has a frequency in the HB band, then G2, G3, and G4 can be configured to detune the MTMN 300 to the Auxiliary Configuration band and improve isolation in the band of interest (i.e., the HB band). In an example embodiment, in the isolation OFF state, the amplifier 202 may also be configured to a lower gain level, or turned OFF, to further improve isolation.

Figure 3B:
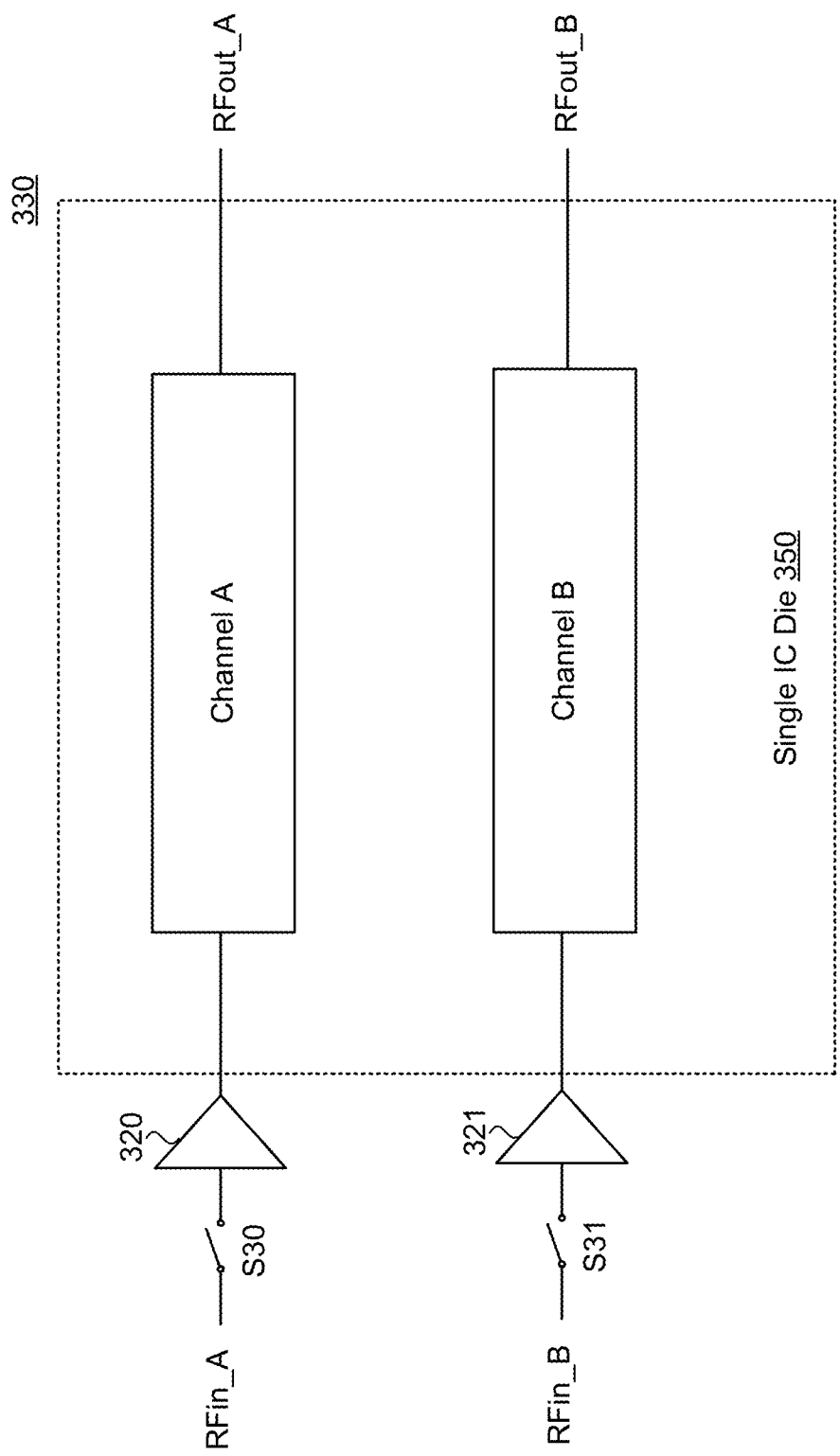
FIG. 3B illustrates a multi-channel system based on the Channel N configuration of FIG. 3A.

FIG. 3B illustrates a multi-channel system 330 based on the Channel N configuration of FIG. 3A. For simplicity of illustration, the multi-channel system 330 is shown in FIG. 3B as a dual channel system having Channels A and B, either or both of which may be instances of Channel N shown in FIG. 3A to provide improved isolation in a band of interest. In the illustrated example, Channel A and Channel B are configured to receive respective RF signals, RFin_A and RFin_B, through respective switches S30, S31 and amplifiers 320, 321 (e.g., LNAs) and provide corresponding output signals RFout_A, RFoutB. In an example embodiment of the multi-channel system 330, both Channels A and B operate at the same frequency and are fabricated on a single integrated circuit die 350.

Implementing the Channel N configuration of FIG. 3A in one or more of the Channels A, B, etc., of the multi-channel system 330 improves isolation between the channels in the isolation OFF state (low gain state). For example, by mistuning the MTMN 300 in or more of Channels A and B in the manner described with respect to FIG. 3A, an improved isolation is achieved between Channels A and B of the multi-channel system 330.

Figure 4A:
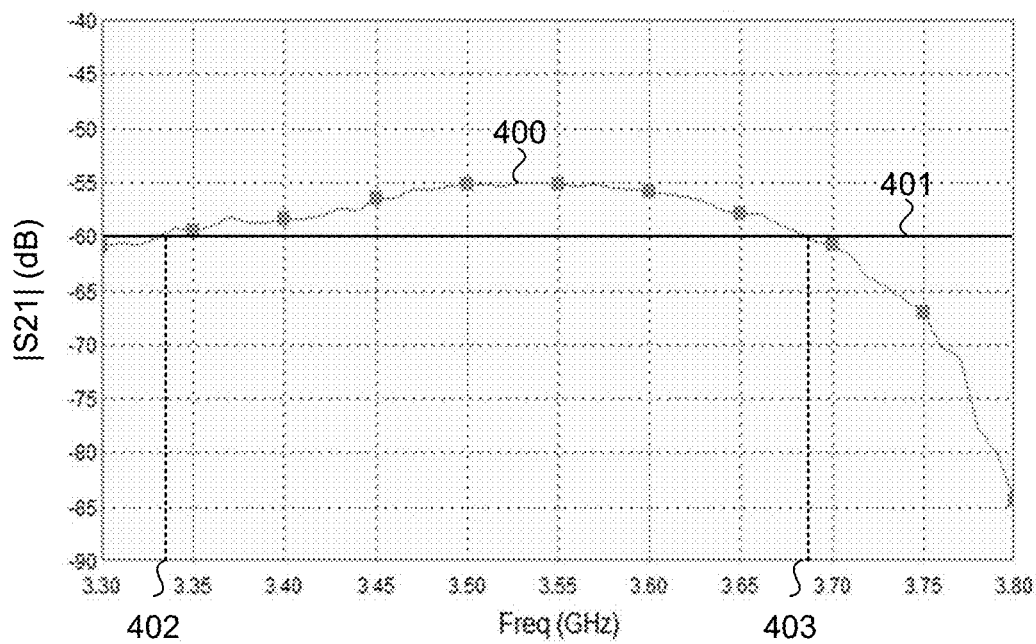
FIG. 4A is a plot of S21 measurements (in dB) versus frequency (in GHz) for a modeled amplifier with a prior art tunable input match circuit and method of operation.

FIG. 4A is a plot of S21 measurements (in dB) versus frequency (in GHz) for a modeled amplifier with a prior art tunable input match circuit and method of operation. Graph line 400 represents the isolation level in the frequency range 3.30 to 3.80 GHz. Graph line 401 represents a desired isolation level, such as −60 dB in this example. A measured isolation level in an OFF state that is less than the desired isolation level indicates insufficient isolation. As shown in FIG. 4A, by rising above graph line 401 (i.e., less negative), the provided isolation level of graph line 400 falls short of the desired isolation level for a frequency range between approximately 3.34 GHz (marker line 402) and 3.69 GHz (marker line 403).

Figure 4B:
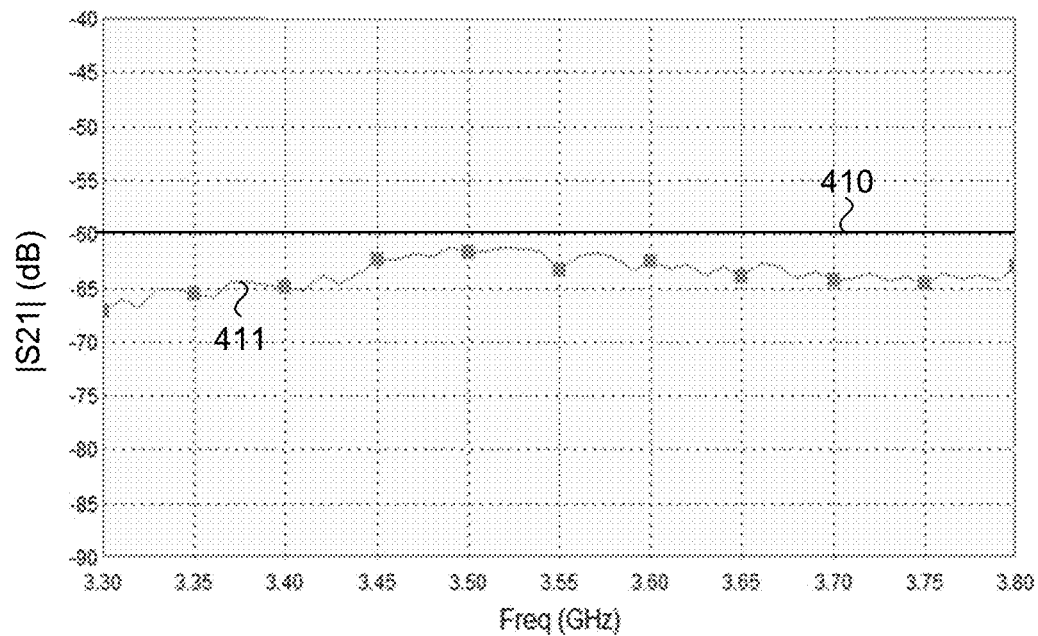
FIG. 4B is a plot of S21 measurements (in dB) versus frequency (in GHz) for a modeled amplifier combined with a tunable input match, and an associated method of operation, illustrating the significantly improved isolation achieved by example embodiments of the present invention.

FIG. 4B is a plot of S21 measurements (in dB) versus frequency (in GHz) for a modeled amplifier combined with a tunable input match, and an associated method of operation, illustrating the significantly improved isolation achieved by example embodiments of the present invention. In contrast to FIG. 4A, as shown in FIG. 4B, when the modeled MTMN 200, 300 is set to the isolation OFF state, the isolation levels represented by graph line 411 are maintained below (i.e., more negative than) the desired isolation level represented by graph line 410 (in this example, −60 db). Thus, as shown in FIG. 4B, embodiments of the present invention provide isolation improvement in a band of interest (e.g., 3.3-3.8 GHz) by detuning the MTMN 200, 300 to a different frequency outside the frequency of the band of interest. The above parallel and compact circuit configurations thus enable the MTMN 200, 300 to shift matching network characteristics in an isolation OFF state, essentially detuning the MTMN 200, 300.

Method

Another aspect of the disclosure includes a method for detuning an MTMN 200, 300 used in multi-channel RF systems. For example, FIG. 5A is a process flow diagram 500 showing a first method of detuning and isolating an MTMN 200, 300 according to the disclosed embodiments. The method shown includes: detuning to an isolation OFF state from an ON state of MTMN 200, 300 coupled to amplifier 202, wherein the match tuning in the isolation OFF state is different than match tuning in the ON state (Block 510).

FIG. 5B is a process flow diagram 515 showing a second method of detuning and isolating an MTMN 200, 300 according to the disclosed embodiments. In the example embodiment shown in FIG. 5B, the detuning in FIG. 5A may be performed by: selecting a frequency band corresponding to an isolation OFF state of the MTMN 200, 300, wherein the selected frequency band is in a different frequency band than a frequency band of match tuning in the ON state (Block 520). The method shown in FIG. 5B also includes match tuning the MTMN 200, 300 to the selected frequency band to detune the MTMN 200, 300 (Block 530).

In an example embodiment of FIG. 5B, the process may further include any of: selecting the frequency band corresponding to an isolation OFF state based on the frequency band of match tuning in the ON state; selecting the different frequency band from a frequency range lower than the frequency band of match tuning in the ON state; and/or wherein the MTMN includes at least a first matching network (MN) corresponding to the frequency band of match tuning in the ON state, and a second MN corresponding to the different frequency band, and switchably coupling the multiband tunable MN to the amplifier via the first MN during the ON state, and switchably decoupling the first MN from the amplifier and switchably coupling the second MN to the amplifier during the isolation OFF state Fabrication Technologies and Options The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments have been described. It is to be understood that various modifications may be made without departing from the spirit and scope of the invention. For example, some of the processes described above may be order independent, and thus can be performed in an order different from that described. Further, some of the processes described above may be optional. Various activities described with respect to the methods identified above can be executed in repetitive, serial, or parallel fashion.

It is to be understood that the foregoing description is intended to illustrate and not to limit the scope of the embodiments, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. An apparatus comprising:
   (a) an amplifier configurable to an isolation OFF state or an ON state; and
   (b) a multiband tunable matching network (MN) coupled to the amplifier and comprising:
      (1) a first node configured to be coupled to a radio frequency signal, a second node coupled to the amplifier, and a plurality of matching network paths coupling the first node to the second node; and
      (2) at least one series-connected switch coupled to a respective matching network path for switchably coupling the respective matching network path in circuit to the amplifier between the first node and the second node;
      wherein the multiband tunable MN is configured as a tuning matching network for the amplifier when the amplifier is configured in the ON state, and configured as a detuning matching network for the amplifier when the amplifier is configured in the isolation OFF state.

2. The apparatus of claim 1, wherein the match tuning of the detuning matching network in the isolation OFF state is in a different frequency band than a frequency band of match tuning of the tuning matching network in the ON state and is selected based on the frequency band of match tuning in the ON state.

3. The apparatus of claim 1, wherein the multiband tunable MN includes at least a first matching network path corresponding to a frequency band of match tuning in the ON state and a second matching network path corresponding to a different frequency band, wherein during the ON state the multiband tunable MN switchably couples to the amplifier via the first matching network path, and wherein during the isolation OFF state the multiband tunable MN switchably decouples the amplifier from the first matching network path, and couples to the amplifier via the second matching network path.

4. The apparatus of claim 3, wherein the first matching network path and the second matching network path are coupled in parallel between the input node and the output node of the multiband tunable MN.

5. The apparatus of claim 2, wherein the different frequency band is of a lower frequency range than the frequency band of match tuning in the ON state.

6. The apparatus of claim 3, wherein the second matching network path comprises a notch filter configured to reject parasitic resonance frequencies that enable a received leakage signal to leak to the amplifier.

7. The apparatus of claim 1, wherein the amplifier comprises a multiband amplifier.

8. An apparatus comprising:
(a) an amplifier configurable to an isolation OFF state or an ON state; and
(b) a multiband tunable matching network (MN) comprising:
 (1) an input node, an output node coupled to the amplifier, and a path coupling the input node to the output node;
 (2) at least one series connected switch coupled to the path, the at least one series connected switch comprising:
  (A) a first bypass switch coupled in series in the path, the first bypass switch coupled at a first end to the input node; and
  (B) a second bypass switch coupled in series between the shunt circuit and the output node; and
 (3) at least one shunt circuit coupled to the path, the shunt circuit comprising a shunt reactive element connected in series with a shunt switch;
wherein the multiband tunable MN is configured as a tuning matching network for the amplifier when the amplifier is configured in the ON state, and is configured as a detuning matching network for the amplifier when the amplifier is configured in the isolation OFF state.

9. The apparatus of claim 8, the at least one shunt circuit comprising a first shunt circuit and a second shunt circuit coupled in parallel to each other, and coupled to the path at a second end of the first bypass switch.

10. The apparatus of claim 9, wherein the multiband tunable MN is configured to operate in an OFF state when the first and second shunt switches are in a closed position, and the second bypass switch is in an open position.

11. The apparatus of claim 9, wherein the multiband tunable MN is configured to operate in a mid-band frequency range when the first shunt switch is in a closed position, and the second shunt switch and the second bypass switch are in an open position.

12. The apparatus of claim 9, wherein the multiband tunable MN is configured to operate in a high-band frequency range or an ultra-high band frequency range when the first and second shunt switches are in an open position, and the second bypass switch is in a closed position.

13. A method comprising:
(a) coupling a multiband tunable matching network (MN) to an amplifier configurable to an isolation OFF state or an ON state, the multiband tunable MN including:
 (1) a first node configured to be coupled to a radio frequency signal, a second node coupled to the amplifier, and a plurality of matching network paths coupling the first node to the second node; and
 (2) at least one series-connected switch coupled to a respective matching network path for switchably coupling the respective matching network path in circuit to the amplifier between the first node and the second node;
(b) configuring the multiband tunable MN as a tuning matching network for the amplifier when the amplifier is configured in the ON state; and
(c) configuring the multiband tunable MN as a detuning matching network for the amplifier when the amplifier is configured in the isolation OFF state.

14. The method of claim 13, further comprising: (a) selecting the match tuning of the detuning matching network in the isolation OFF state to be in a different frequency band than a frequency band of match tuning of the tuning matching network in the ON state.

15. The method of claim 14, further comprising selecting the different frequency band corresponding to the isolation OFF state based on the frequency band of match tuning in the ON state.

16. The method of claim 14, further comprising selecting the different frequency band from a frequency range lower than the frequency band of match tuning in the ON state.

17. The method of claim 13, wherein the multiband tunable MN includes at least a first matching network path corresponding to a frequency band of match tuning in the ON state, and a second matching network path corresponding to a different frequency band of match tuning in the isolation OFF state, the method further comprising:
(a) switchably coupling the first node of the multiband tunable MN to the amplifier through the second node via the first matching network path during the ON state; and
(b) switchably decoupling the first matching network path from the amplifier and switchably coupling the first node of the multiband tunable MN to the amplifier through the second node via the second matching network path during the isolation OFF state.

18. The method of claim 17, wherein the first matching network path and the second matching network path are coupled in parallel between the input node and the output node of the multiband tunable MN.

19. The method of claim 17, wherein the second matching network path comprises a notch filter configured to reject parasitic resonance frequencies that enable a received leakage signal to leak to the amplifier.

20. The method of claim 17, wherein the amplifier comprises a multiband amplifier.

* * * * *